United States Patent
Hsieh et al.

(10) Patent No.: US 8,237,182 B2
(45) Date of Patent: Aug. 7, 2012

(54) ORGANIC ADHESIVE LIGHT-EMITTING DEVICE WITH OHMIC METAL BULGE

(75) Inventors: Min-Hsun Hsieh, Hsin-Chu (TW);
Wen-Huang Liu, Hsin-Chu (TW);
Tzu-Feng Tseng, Hsin-Chu (TW);
Ya-Lan Yang, Hsin-Chu (TW)

(73) Assignee: Epistar Corporation, Science-based Industrial Park, Hsinchu (TW)

( * ) Notice: Subject to any disclaimer, the term of this patent is extended or adjusted under 35 U.S.C. 154(b) by 0 days.

(21) Appl. No.: 10/905,697

(22) Filed: Jan. 18, 2005

(65) Prior Publication Data

US 2005/0194587 A1    Sep. 8, 2005

(30) Foreign Application Priority Data

Feb. 20, 2004    (TW) ................ 93104393 A

(51) Int. Cl.
*H01L 33/00*    (2010.01)

(52) U.S. Cl. ............ 257/98; 257/100; 257/103; 257/79; 257/81; 257/99; 257/E33.068

(58) Field of Classification Search ............ 257/40, 257/78–103, E33.068
See application file for complete search history.

(56) References Cited

U.S. PATENT DOCUMENTS

| | | | |
|---|---|---|---|
| 6,198,091 B1 * | 3/2001 | Forrest et al. | 250/214.1 |
| 6,462,358 B1 * | 10/2002 | Lin et al. | 257/99 |
| 6,674,097 B2 * | 1/2004 | Komoto et al. | 257/98 |
| 6,682,950 B2 | 1/2004 | Yang et al. | |
| 6,797,987 B2 * | 9/2004 | Chen | 257/98 |
| 7,015,513 B2 * | 3/2006 | Hsieh | 257/99 |
| 2003/0116770 A1 * | 6/2003 | Chang et al. | 257/79 |
| 2003/0143772 A1 * | 7/2003 | Chen | 438/47 |
| 2003/0164503 A1 * | 9/2003 | Chen | 257/79 |
| 2004/0104395 A1 * | 6/2004 | Hagimoto et al. | 257/79 |

FOREIGN PATENT DOCUMENTS

| | | | |
|---|---|---|---|
| CH | 093101466 | * | 1/2004 |
| DE | 100 17 337 A1 | | 10/2001 |
| DE | 10204386 B4 | | 4/2003 |
| DE | 202 14 521 U1 | | 9/2003 |
| DE | 103 31 825 A1 | | 2/2004 |
| JP | H05251739 | | 9/1993 |
| JP | P2000500617 A | | 1/2000 |
| JP | P2001244503 A | | 9/2001 |
| JP | P2003197968 A | | 7/2003 |
| JP | P2003243699 A | | 8/2003 |

* cited by examiner

*Primary Examiner* — Zandra Smith
*Assistant Examiner* — Tsz Chiu
(74) *Attorney, Agent, or Firm* — Winston Hsu; Scott Margo

(57) ABSTRACT

Organic adhesive light-emitting device with ohmic metal bulge. The organic adhesive light-emitting device includes a conductive substrate, a light-emitting stack layer, a metal layer formed over the conductive substrate, a reflective layer formed over the light-emitting stack layer, and an organic adhesive layer having an ohmic metal bulge and an adhesive material around the ohmic metal bulge. The adhesive material bonds the metal layer and the reflective layer together, while the ohmic metal bulge forms ohmic contacts with the metal layer and the reflective layer. The configuration can simplify a light-emitting diode.

25 Claims, 3 Drawing Sheets

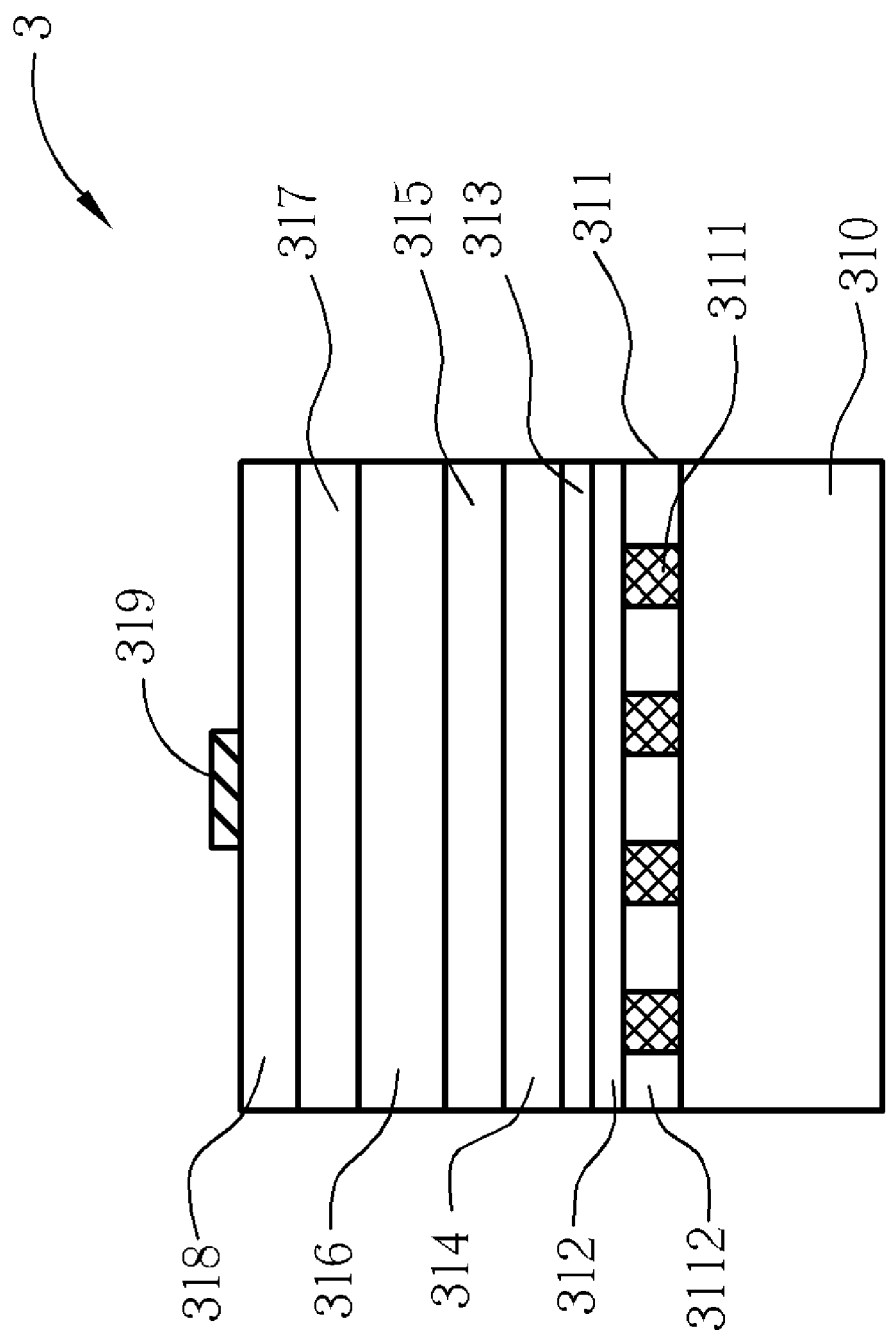

ORGANIC ADHESIVE LIGHT-EMITTING DEVICE WITH OHMIC METAL BULGE

BACKGROUND OF INVENTION

1. Field of the Invention

The present invention provides a light-emitting element, and more particularly, an organic adhesive light-emitting device with an ohmic metal bulge.

2. Description of the Prior Art

The applications of light-emitting diodes (LED) are extensive and include such applications as optical display devices, traffic signals, data storing devices, communications devices, illumination devices, and medical apparatuses. An important issue is how to lower the manufacturing cost of LEDs.

A light-emitting diode and its related method of manufacture are disclosed in U.S. Pat. No. 6,682,950, in which a light-emitting diode layer is bonded to a transparent substrate by means of a transparent adhesive layer. Nevertheless, the prior art method, due to the non-conductivity of the transparent adhesive layer, while being suitable for use in diodes of which two electrodes are located at the same side, is not suitable for use in diodes of which electrodes are respectively located at the upper surface and lower surface of the diode. In addition, part of the diode stack layer needs to be removed by means of an etching process to produce two electrodes at the same side. In doing so, not only is material wasted, but also the complexity of the processes is increased.

SUMMARY OF INVENTION

It is therefore an object of the claimed invention to develop a light emitting diode having an organic adhesive layer with an ohmic metal bulge for sticking a conductive substrate and a light-emitting stack layer together, which forms ohmic contacts, so as to conduct current, and to simplify manufacturing processes and to reduce the cost of the diode.

Briefly described, the claimed invention discloses an organic adhesive light-emitting device with an ohmic metal bulge. The organic adhesive light-emitting device comprises a conductive substrate, a light-emitting stack layer, a metal layer formed over the conductive substrate, a reflective layer formed over the light-emitting stack layer, an organic adhesive layer with an ohmic metal bulge. The metal layer comprises an ohmic metal bulge for forming an ohmic contact between the metal layer and the reflective layer, and an adhesive material around the ohmic metal bulge for bonding the metal layer and the reflective layer together.

According to the claimed invention, the conductive substrate comprises at least one material selected from a material group consisting of GaP, GaAsP, AlGaAs, Si, Ge, and SiC, or other substitute materials. The adhesive material comprises at least one material selected from a material group consisting of PI, BCB, and PFCB, or other substitute materials. The ohmic metal bulge comprises at least one material selected from a material group consisting of In, Sn, Al, Au, Pt, Zn, Ge, Ag, Ti, Pb, Pd, Cu, AuBe, AuGe, Ni, PbSn, and AuZn, or other substitute materials. The reflective layer comprises at least one material selected from a material group consisting of In, Sn, Al, Au, Pt, Zn, Ge, Ag, Ti, Pb, Pd, Cu, AuBe, AuGe, Ni, Cr, PbSn, AuZn, and indium tin oxide, or other substitute materials. The metal layer comprises at least one material selected from a material group consisting of In, Sn, Al, Au, Pt, Zn, Ge, Ag, Ti, Pb, Pd, Cu, AuBe, AuGe, Ni, Cr, PbSn, and AuZn, or other substitute materials. The light-emitting layer comprises at least one material selected from a material group consisting of AlGaInP, GaN, InGaN, and AlInGaN, or other substitute materials.

These and other objects of the claimed invention will no doubt become obvious to those of ordinary skill in the art after reading the following detailed description of the preferred embodiment that is illustrated in the various figures and drawings.

BRIEF DESCRIPTION OF DRAWINGS

FIG. 3 illustrates a schematic diagram of a present invention light-emitting diode having an organic adhesive layer with an ohmic metal bulge.

DETAILED DESCRIPTION

Figure 1:
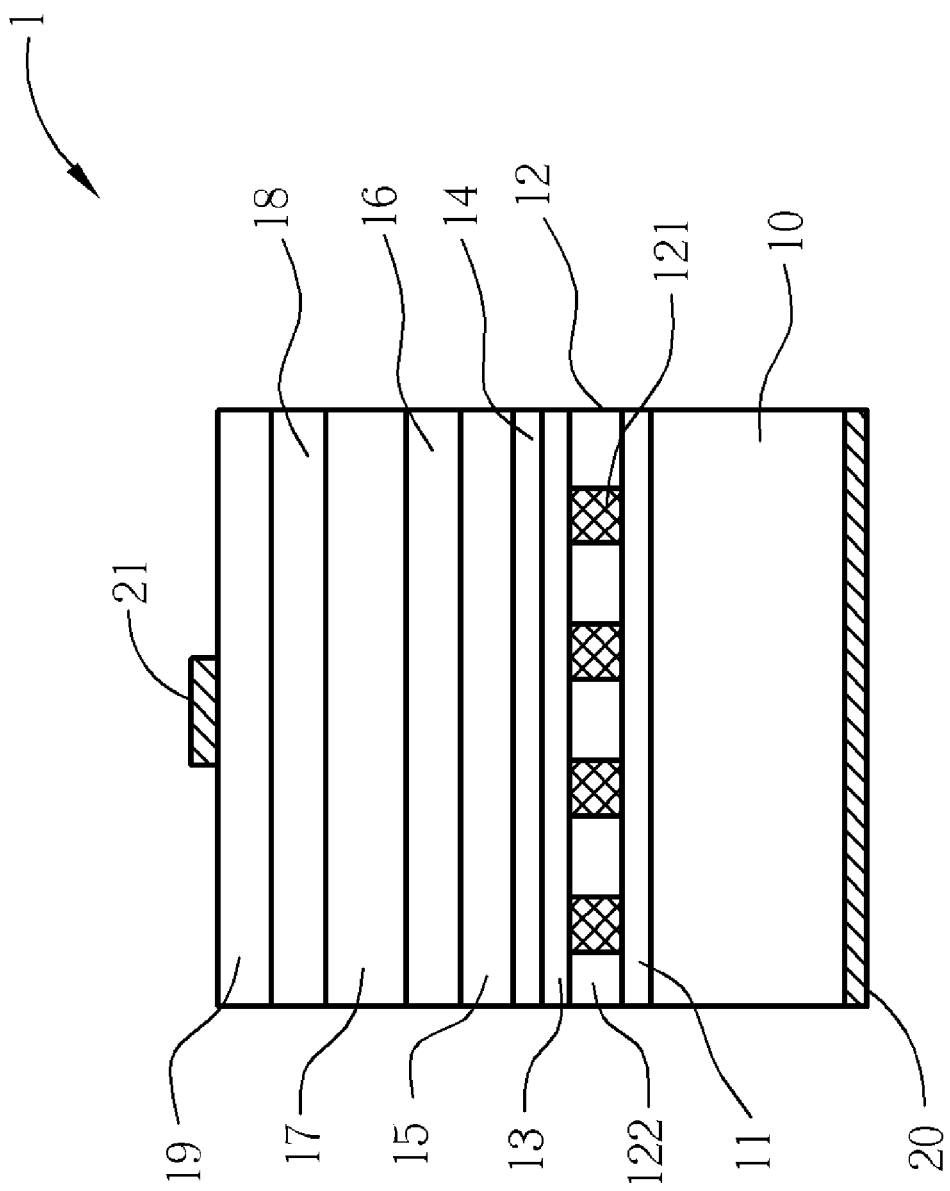
FIG. 1 illustrates a schematic diagram of a present invention light-emitting diode having an organic adhesive layer with an ohmic metal bulge.

Please refer to FIG. 1, which illustrates an organic adhesive light-emitting device 1. The organic adhesive light-emitting device 1 includes a first electrode 20, a conductive substrate 10 formed over the first electrode 20, a metal layer 11 formed over the conductive substrate 10, and an organic adhesive layer 12 formed over the metal layer 11. The organic adhesive layer 12 includes an ohmic metal bulge 121 and an adhesive material 122 around the ohmic metal bulge 121. The adhesive material 122 adheres to a portion of the metal layer 11, while the ohmic metal bulge 121 adheres to another portion of the metal layer 11 for forming an ohmic contact and a reflective layer 13 on the organic adhesive layer 12. Furthermore, the adhesive material 122 adheres to a portion of the reflective layer 13, while the ohmic metal bulge 121 adheres to: another portion of the reflective layer 13 for forming an ohmic contact, a transparent conductive layer 14 on the reflective layer 13, a first contact layer 15 on the transparent conductive layer 14, a first cladding layer 16 on the first contact layer 15, a light-emitting layer 17 on the first cladding layer 16, a second cladding layer 18 on the light-emitting layer 17, a second contact layer 19 on the second cladding layer 18, and a second electrode 21 on the second contact layer 19. The reflective layer 13 can be eliminated because it is included solely to increase brightness. If the reflective layer 13 is eliminated, the metal layer 11 can be replaced with a metal reflective layer for reflecting.

Figure 2:
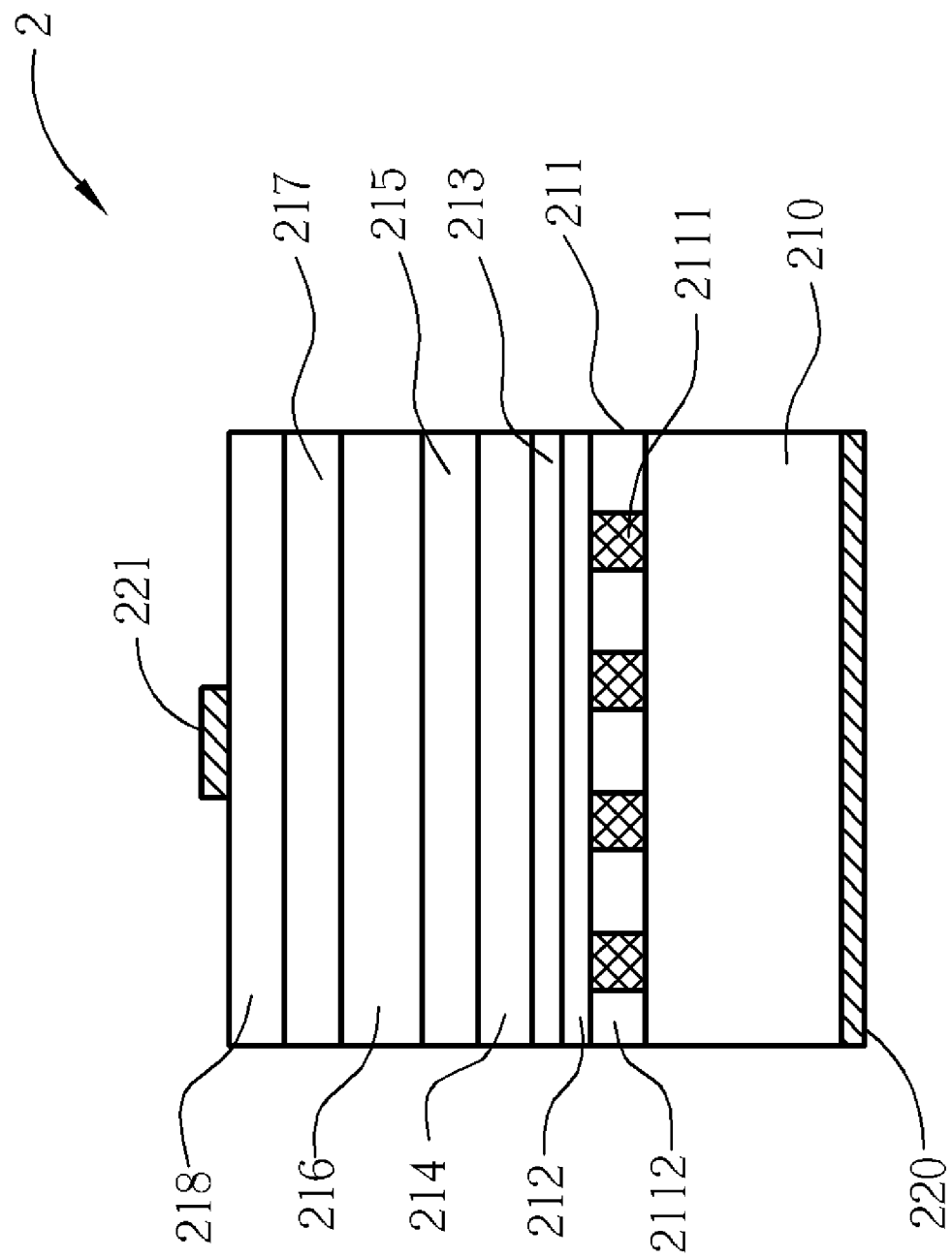
FIG. 2 illustrates a schematic diagram of a present invention light-emitting diode having an organic adhesive layer with an ohmic metal bulge.

Please refer to FIG. 2, which illustrates an organic adhesive light-emitting device 2. The organic adhesive light-emitting device 2 includes a first electrode 220, a conductive substrate 210 formed over the first electrode 220, and an organic adhesive layer 211 formed over the conductive substrate 210. The organic adhesive layer 211 includes an ohmic metal bulge 2111 and an adhesive material 2112 around the ohmic metal bulge 2111. The adhesive material 2112 adheres to a portion of the conductive substrate 210, while the ohmic metal bulge 2111 adheres to another portion of the conductive substrate 210 for forming an ohmic contact and a reflective layer 212 on the organic adhesive layer 211. Furthermore, the adhesive material 2112 adheres to a portion of the reflective layer 212, while the ohmic metal bulge 2111 adheres to: another portion of the reflective layer 212 for forming an ohmic contact, a transparent conductive layer 213 on the reflective layer 212, a first contact layer 214 on the transparent conductive layer 213, a first cladding layer 215 on the first contact layer 214, a light-emitting layer 216 on the first cladding layer 215, a second cladding layer 217 on the light-emitting layer 216, a second contact layer 218 on the second cladding layer 217, and a second electrode 221 on the second contact layer 218. The reflective layer 212 can be replaced with a metal layer for forming an ohmic contact with the ohmic metal bulge 2111.

Please refer to FIG. 3, which illustrates an organic adhesive light-emitting device 3. The organic adhesive light-emitting device 3 includes a metal substrate 310, and an organic adhesive layer 311 formed over the metal substrate 310. The organic adhesive layer 311 includes an ohmic metal bulge 3111 and an adhesive material 3112 around the ohmic metal bulge 3111. The adhesive material 3112 adheres to a portion of the metal substrate 310, while the ohmic metal bulge 3111 adheres to another portion of the metal substrate 310 for forming an ohmic contact and a reflective layer 312 on the organic adhesive layer 311. Furthermore, the adhesive material 3112 adheres to a portion of the reflective layer 312, while the ohmic metal bulge 3111 adheres to: another portion of the reflective layer 312 for forming an ohmic contact, a transparent conductive layer 313 on the reflective layer 312, a first contact layer 314 on the transparent conductive layer 313, a first cladding layer 315 on the first contact layer 314, a light-emitting layer 316 on the first cladding layer 315, a second cladding layer 317 on the light-emitting layer 316, a second contact layer 318 on the second cladding layer 317, and a first electrode 319 on the second contact layer 318.

In the above, the conductive substrate includes at least one material selected from a material group consisting of GaP, GaAsP, AlGaAs, Si, Ge, and SiC, or other substitute materials. The metal substrate includes at least one material selected from a material group consisting of Cu, Al, Mo, and MMC (metal matrix composite) carrier, or other substitute materials. The MMC carrier is a carrier with holes having been injected with a proper metal, so as to provide an adjustable heat conductive coefficient or a heat expansive coefficient. The adhesive material includes at least one material selected from a material group consisting of PI, BCB, and PFCB, or other substitute materials. The ohmic metal bulge includes at least one material selected from a material group consisting of In, Sn, Al, Au, Pt, Zn, Ge, Ag, Ti, Pb, Pd, Cu, AuBe, AuGe, Ni, PbSn, and AuZn, or other substitute materials. The reflective layer includes at least one material selected from a material group consisting of In, Sn, Al, Au, Pt, Zn, Ge, Ag, Ti, Pb, Pd, Cu, AuBe, AuGe, Ni, Cr, PbSn, AuZn, and indium tin oxide, or other substitute materials. The metal layer includes at least one material selected from a material group consisting of In, Sn, Al, Au, Pt, Zn, Ge, Ag, Ti, Pb, Pd, Cu, AuBe, AuGe, Ni, Cr, PbSn, and AuZn, or other substitute materials. The transparent conductive layer includes at least one material selected from a material group consisting of indium tin oxide, cadmium tin oxide, antimony tin oxide, zinc oxide, and zinc tin oxide, or other substitute materials. The first cladding layer includes at least one material selected from a material group consisting of AlGaInP, AlInP, AlN, GaN, AlGaN, InGaN, and AllnGaN, or other substitute materials. The light-emitting layer includes at least one material selected from a material group consisting of AlGaInP, GaN, InGaN, and AlIn-GaN, or other substitute materials. The second cladding layer includes at least one material selected from a material group consisting of AlGaInP, AlInP, AlN, GaN, AlGaN, InGaN, and AllnGaN, or other substitute materials. The second contact layer includes at least one material selected from a material group consisting of GaP, GaAs, GaAsP, InGaP, AlGaInP, AlGaAs, GaN, InGaN, and AlGaN, or other substitute materials. The first contact layer includes at least one material selected from a material group consisting of GaP, GaAs, GaAsP, InGaP, AlGaInP, AlGaAs, GaN, InGaN, and AlGaN, or other substitute materials.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An organic adhesive light-emitting device with an ohmic metal bulge comprising:
    a conductive substrate;
    an organic adhesive layer formed over the conductive substrate comprising an ohmic metal bulge, an adhesive material around the ohmic metal bulge; the adhesive material adhering to a portion of the conductive substrate, wherein the ohmic metal bulge forms an ohmic contact with another portion of the conductive substrate to conduct current therebetween; and
    a light-emitting stack layer formed over the organic adhesive layer; the adhesive material adhering to a portion of the light-emitting stack layer, wherein the ohmic metal bulge forms an ohmic contact with another portion of the light-emitting stack layer to conduct current therebetween.

2. The organic adhesive light-emitting device of claim 1 further comprising a metal layer between the conductive substrate and the organic adhesive layer; the metal layer forming an ohmic contact with the ohmic metal bulge and adhering to the adhesive material.

3. The organic adhesive light-emitting device of claim 1 further comprising a reflective layer between the organic adhesive layer and the light-emitting stack layer.

4. The organic adhesive light-emitting device of claim 2 wherein the metal layer between the conductive substrate and the organic adhesive layer is a metal reflective layer.

5. The organic adhesive light-emitting device of claim 1 wherein the conductive substrate comprises at least one material selected from a material group consisting of GaP, GaAsP, AlGaAs, Si, Ge, and SiC.

6. The organic adhesive light-emitting device of claim 1 wherein the ohmic metal bulge comprises at least one material selected from a material group consisting of In, Sn, Al, Au, Pt, Zn, Ge, Ag, Ti, Pb, Pd, Cu, AuBe, AuGe, Ni, PbSn, and AuZn.

7. The organic adhesive light-emitting device of claim 1 wherein the adhesive material comprises at least one material selected from a material group consisting of PI, BCB, and PFCB.

8. The organic adhesive light-emitting device of claim 2 wherein the metal layer comprises at least one material selected from a material group consisting of In, Sn, Al, Au, Pt, Zn, Ge, Ag, Ti, Pb, Pd, Cu, AuBe, AuGe, Ni, Cr, PbSn, and AuZn.

9. The organic adhesive light-emitting device of claim 3 wherein the reflective layer comprises at least one material selected from a material group consisting of In, Sn, Al, Au, Pt, Zn, Ge, Ag, Ti, Pb, Pd, Cu, AuBe, AuGe, Ni, Cr, PbSn, AuZn, and indium tin oxide.

10. The organic adhesive light-emitting device of claim 1 wherein the conductive substrate is a metal substrate.

11. The organic adhesive light-emitting device of claim 10 wherein the metal substrate comprises at least one material selected from a material group consisting of Cu, Al, Mo, and MMC carrier or other substitute materials.

12. The organic adhesive light-emitting device of claim 1 wherein the light-emitting stack layer comprises:

a first contact layer;
a first cladding layer formed over the first contact layer;
a light-emitting layer formed over the first cladding layer;
a second cladding layer formed over the light-emitting layer; and
a second contact layer formed over the second cladding layer.

13. The organic adhesive light-emitting device of claim 1 further comprising a first electrode formed over the conductive substrate, and a second electrode formed over the light-emitting stack layer.

14. The organic adhesive light-emitting device of claim 3 further comprising a transparent conductive layer between the reflective layer and the light-emitting stack layer.

15. The organic adhesive light-emitting device of claim 10 further comprising an electrode formed over the light-emitting stack layer.

16. The organic adhesive light-emitting device of claim 14 wherein the transparent conductive layer comprises at least one material selected from a material group consisting of indium tin oxide, cadmium tin oxide, antimony tin oxide, zinc oxide, zinc tin oxide, Be/Au, Ge/Au and Ni/Au.

17. The organic adhesive light-emitting device of claim 12 wherein the first contact layer comprises at least one material selected from a material group consisting of GaP, GaAs, GaAsP, InGaP, AlGaInP, AlGaAs, GaN, InGaN, and AlGaN.

18. The organic adhesive light-emitting device of claim 12 wherein the first cladding layer comprises at least one material selected from a material group consisting of AlGaInP, AlInP, AlN, GaN, AlGaN, InGaN, and AlInGaN.

19. The organic adhesive light-emitting device of claim 12 wherein the light-emitting layer comprises at least one material selected from a material group consisting of AlGaInP, GaN, InGaN, and AlInGaN.

20. The organic adhesive light-emitting device of claim 12 wherein the second cladding layer comprises at least one material selected from a material group consisting of AlGaInP, AlInP, AlN, GaN, AlGaN, InGaN, and AlInGaN.

21. The organic adhesive light-emitting device of claim 12 wherein the second contact layer comprises at least one material selected from a material group consisting of GaP, GaAs, GaAsP, InGaP, AlGaInP, AlGaAs, GaN, InGaN, and AlGaN.

22. The organic adhesive light-emitting device of claim 13 further comprising a transparent conductive layer over the second contact layer, below the second electrode.

23. The organic adhesive light-emitting device of claim 15 further comprising a transparent conductive layer over the light-emitting stack layer, below the electrode.

24. The organic adhesive light-emitting device of claim 22 wherein the transparent conductive layer comprises at least one material selected from a material group consisting of indium tin oxide, cadmium tin oxide, antimony tin oxide, zinc oxide, zinc tin oxide, Be/Au, Ge/Au and Ni/Au.

25. The organic adhesive light-emitting device of claim 23 wherein the transparent conductive layer comprises at least one material selected from a material group consisting of indium tin oxide, cadmium tin oxide, antimony tin oxide, zinc oxide, zinc tin oxide, Be/Au, Ge/Au and Ni/Au.

* * * * *